US012665596B2

(12) United States Patent (10) Patent No.: US 12,665,596 B2
Eleendram et al. (45) Date of Patent: Jun. 23, 2026

(54) CLOCK BUFFER CIRCUIT WITH IMPROVED TRANSITION TIMES

(71) Applicant: NXP B.V., Eindhoven (NL)

(72) Inventors: Harish Eleendram, Tirupati (IN); Anand Kumar Sinha, Noida (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/883,115

(22) Filed: Sep. 12, 2024

(65) Prior Publication Data

US 2025/0119141 A1 Apr. 10, 2025

(30) Foreign Application Priority Data

Oct. 9, 2023 (IN) .............................. 202341067517

(51) Int. Cl.
| | |
|---|---|
| *H03K 19/00* | (2006.01) |
| *H03K 3/012* | (2006.01) |
| *H03K 3/037* | (2006.01) |

(52) U.S. Cl.
CPC ......... *H03K 19/0013* (2013.01); *H03K 3/012* (2013.01); *H03K 3/037* (2013.01)

(58) Field of Classification Search
CPC .... H03K 19/0013; H03K 3/012; H03K 3/037; H03K 19/018521; H03K 19/20; H03K 19/018507; H03K 19/00315; H03K 3/356113; H03K 5/2481; H03K 17/687; H03K 19/017509; H03K 17/6872; H03K 19/0185; H03K 17/223; H03K 19/0016; H03K 17/6871; H03K 3/011; H03K 3/35625; H03K 19/18528;

(Continued)

(56) References Cited

U.S. PATENT DOCUMENTS 5,583,457 A * 12/1996 Horiguchi .......... H03K 19/0016
327/544
5,929,688 A * 7/1999 Ueno ............... H03K 3/356113
327/333

(Continued)

OTHER PUBLICATIONS

Cheng, et al.: "The Charge-Transfer Feedback-Controlled Split-Path CMOS Buffer," IEEE Transactions on Circuits and Systems—II: Analog and Digital Signal Processing, vol. 46, No. 3, Mar. 1999, DOI: 10.1109/82.754867, pp. 346-348.

(Continued)

*Primary Examiner* — John W Poos
(74) *Attorney, Agent, or Firm* — Joanna G. Geld

(57) ABSTRACT

An inverter circuit, usable in a clock buffer circuit, includes a main inverter stage having a first transistor of a first conductivity type coupled in series with a second transistor of a second conductivity type, wherein control electrodes of the first and second transistors are coupled to an input node and first current electrodes of the first and second transistors are coupled at an output node. The inverter circuit also includes a first set of additional transistors of the first conductivity type, a second set of additional transistors of the second conductivity type, and a set of switches configured to connect a first transistor of the first set of additional transistors in series with the first transistor for a first time period while connecting a first transistor of the second set of additional transistors in parallel with the second transistor during the first time period.

20 Claims, 3 Drawing Sheets

(58) Field of Classification Search
CPC .......... H03K 19/00361; H03K 5/1565; H03K 3/0315; H03K 3/35613; H03K 3/3565; H03K 3/356104; H03K 19/00384; H03K 3/0375; H03K 3/356182; H03K 3/0231; H03K 5/135; H03K 19/018557; H03K 3/017; H03K 19/0175; H03K 19/0948; H03K 19/003; H03K 3/0372; H03K 3/356; H03K 17/162; H03K 19/017; H03K 19/094; H03K 3/3562; H03K 5/249; H03K 17/102; H03K 17/161; H03K 17/693; H03K 5/2472; H03K 3/013; H03K 17/284; H03K 2217/0081; H03K 3/356139; H03K 3/356121; H03K 5/01; H03K 3/354; H03K 3/356017; H03K 3/356165; H03K 3/133; H03K 17/04106; H03K 5/134; H03K 5/22; H03K 5/24; H03K 2217/0063; H03K 17/063; H03K 17/567; H03K 19/21; H03K 2217/0054; H03K 5/08; H03K 7/08; H03K 19/00338; H03K 2217/0018; H03K 3/356173; H03K 17/0822; H03K 19/00; H03K 19/0027; H03K 19/01721; H03K 19/017545; H03K 2005/00071; H03K 3/0322; H03K 3/356156; H03K 17/06; H03K 17/08104; H03K 19/0944; H03K 5/1252; H03K 19/00323; H03K 19/01707; H03K 19/018585; H03K 2005/00208; H03K 5/13; H03K 5/1515; H03K 5/1534; H03K 5/156; H03K 17/145; H03K 19/00369; H03K 19/1776; H03K 3/02337; H03K 3/027; H03K 3/57; H03K 19/018571; H03K 2005/00195; H03K 3/03; H03K 3/353; H03K 5/151; H03K 17/04123; H03K 17/166; H03K 17/22; H03K 19/0005; H03K 19/00346; H03K 19/01742; H03K 19/17796; H03K 3/02; H03K 3/021; H03K 3/356191; H03K 5/00; H03K 5/14; H03K 17/005; H03K 17/08; H03K 17/08122; H03K 19/01855; H03K 19/0813; H03K 19/1737; H03K 19/215; H03K 19/23; H03K 2005/00013; H03K 2005/00019; H03K 23/667; H03K 3/023; H03K 17/08142; H03K 17/165; H03K 17/30; H03K 19/0008; H03K 19/007; H03K 19/09429; H03K 4/50; H03K 4/502; H03K 5/125; H03K 17/163; H03K 17/168; H03K 17/6874; H03K 19/0136; H03K 19/09432; H03K 19/096; H03K 19/1733; H03K 2217/0072; H03K 2217/94; H03K 23/58; H03K 3/0233; H03K 3/356008; H03K 3/356069; H03K 3/84; H03K 5/00006; H03K 5/06; H03K 5/15013; H03K 17/167; H03K 17/28; H03K 17/302; H03K 19/0002; H03K 19/00307; H03K 19/01; H03K 19/01759; H03K 2005/00052; H03K 2005/00078; H03K 21/02; H03K 2217/0036; H03K 23/44; H03K 3/01; H03K 3/356043; H03K 3/36; H03K 5/131; H03K 5/15006; H03K 5/153; H03K 17/04; H03K 17/04206; H03K 17/16; H03K 17/164; H03K 19/018514; H03K 19/018564; H03K 19/02; H03K 19/0963; H03K 19/173; H03K 19/1738; H03K 19/17788; H03K 2005/00039; H03K 2005/00286; H03K 2017/0806; H03K 3/0377; H03K 3/355; H03K 3/356147; H03K 4/06; H03K 4/56; H03K 5/02; H03K 5/023; H03K 5/04; H03K 5/082; H03K 5/12; H03K 5/1506; H03K 5/15093; H03K 5/159; H03K 5/26; H03K 19/001; H03K 19/0019; H03K 19/01714; H03K 19/09448; H03K 2005/00228; H03K 2005/00241; H03K 21/026; H03K 21/10; H03K 2217/0027; H03K 23/64; H03K 23/68; H03K 3/3545; H03K 3/356026; H03K 3/35606; H03K 3/356086; H03K 3/42; H03K 3/53; H03K 3/86; H03K 4/501; H03K 5/003; H03K 5/007; H03K 5/05; H03K 5/086; H03K 17/002; H03K 17/042; H03K 17/04213; H03K 17/08126; H03K 17/0826; H03K 17/10; H03K 17/12; H03K 17/296; H03K 17/56; H03K 17/60; H03K 17/6877; H03K 17/689; H03K 17/96; H03K 19/0021; H03K 19/00353; H03K 19/01728; H03K 19/017518; H03K 19/017527; H03K 19/017536; H03K 19/018592; H03K 19/09403; H03K 19/09407; H03K 19/09421; H03K 19/16; H03K 19/177; H03K 19/17704; H03K 19/17736; H03K 19/17744; H03K 19/17768; H03K 19/1778; H03K 19/212; H03K 2005/00032; H03K 2005/00221; H03K 2005/00234; H03K 23/662; H03K 3/014; H03K 3/02315; H03K 3/02335; H03K 3/0307; H03K 3/038; H03K 3/356052; H03K 4/48; H03K 5/084; H03K 6/04; H03K 9/08; H03K 17/081; H03K 17/082; H03K 17/122; H03K 17/14; H03K 17/18; H03K 17/602; H03K 17/6257; H03K 17/74; H03K 19/01735; H03K 19/01806; H03K 19/01825; H03K 19/0941; H03K 19/09441; H03K 19/1772; H03K 19/17724; H03K 19/17748; H03K 19/17764; H03K 19/17772; H03K 2005/00058; H03K 2005/00156; H03K 2005/00247; H03K 21/38; H03K 2217/94042; H03K 23/002; H03K 3/015; H03K 3/356078; H03K 3/64; H03K 5/065; H03K 5/15; H03K 5/19; H03K 5/2427; H03K 7/06; H03K 7/10
See application file for complete search history.

(56) References Cited

U.S. PATENT DOCUMENTS

| | | | | |
|---|---|---|---|---|
| 6,160,422 A * | 12/2000 | Huang | ............... | H03K 19/0013 326/95 |
| 6,288,573 B1 * | 9/2001 | Tanizaki | ............... | G11C 11/412 326/119 |
| 6,686,773 B1 | 2/2004 | Dash et al. | | |
| 7,312,626 B2 | 12/2007 | Forbes | | |
| 2005/0206431 A1 * | 9/2005 | Fournel | .......... | H03K 19/018521 327/333 |
| 2015/0303921 A1 * | 10/2015 | Jung | ............. | H03K 19/018521 327/333 |

OTHER PUBLICATIONS

Yoo: "A CMOS Buffer Without Short-Circuit Power Consumption," IEEE Transactions on Circuits and Systems II: Analog and Digital Signal Processing (vol. 47, Issue: 9, Sep. 2000), DOI: 10.1109/82. 868462, pp. 935-937.

* cited by examiner

CLOCK BUFFER CIRCUIT WITH IMPROVED TRANSITION TIMES

CROSS-REFERENCE TO RELATED APPLICATIONS

This application claims the priority under 35 U.S.C. § 119 of India application No. 202341067517, filed on 9 Oct. 2023, the contents of which are incorporated by reference herein.

BACKGROUND

Field

This disclosure relates generally to integrated circuits, and more specifically, to a clock buffer circuit with improved transition times.

Related Art

Within a clock generation circuit, the faster the high-to-low or low-to-high transition times, the greater the power consumption. Therefore, in low power applications, the clock generated from a clock source, such as a crystal oscillator, typically has slow transition times in order to save power. However, the slower the transition times for the generated clock, the more difficult it becomes to buffer the clock to sufficiently drive a required load with improved transition times while reducing power consumption.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an inverter circuit of a buffer includes a feed-back mechanism which controls the strengths of the pull-up and pull-down networks of the inverter. This allows for the optimization of the time during which both the pull-up or pull-down networks are in the ON state. This allows for a reduced short circuit current (and thus reduced power consumption) while achieving faster transition times of the output of the inverter circuit. In one embodiment, the feed-back mechanism includes a set of transistors and switches which allow the pull-up or pull-down network of the inverter to either operate in parallel, thereby reducing resistance of the network, or series, thereby increasing resistance of the network.

Figure 1:
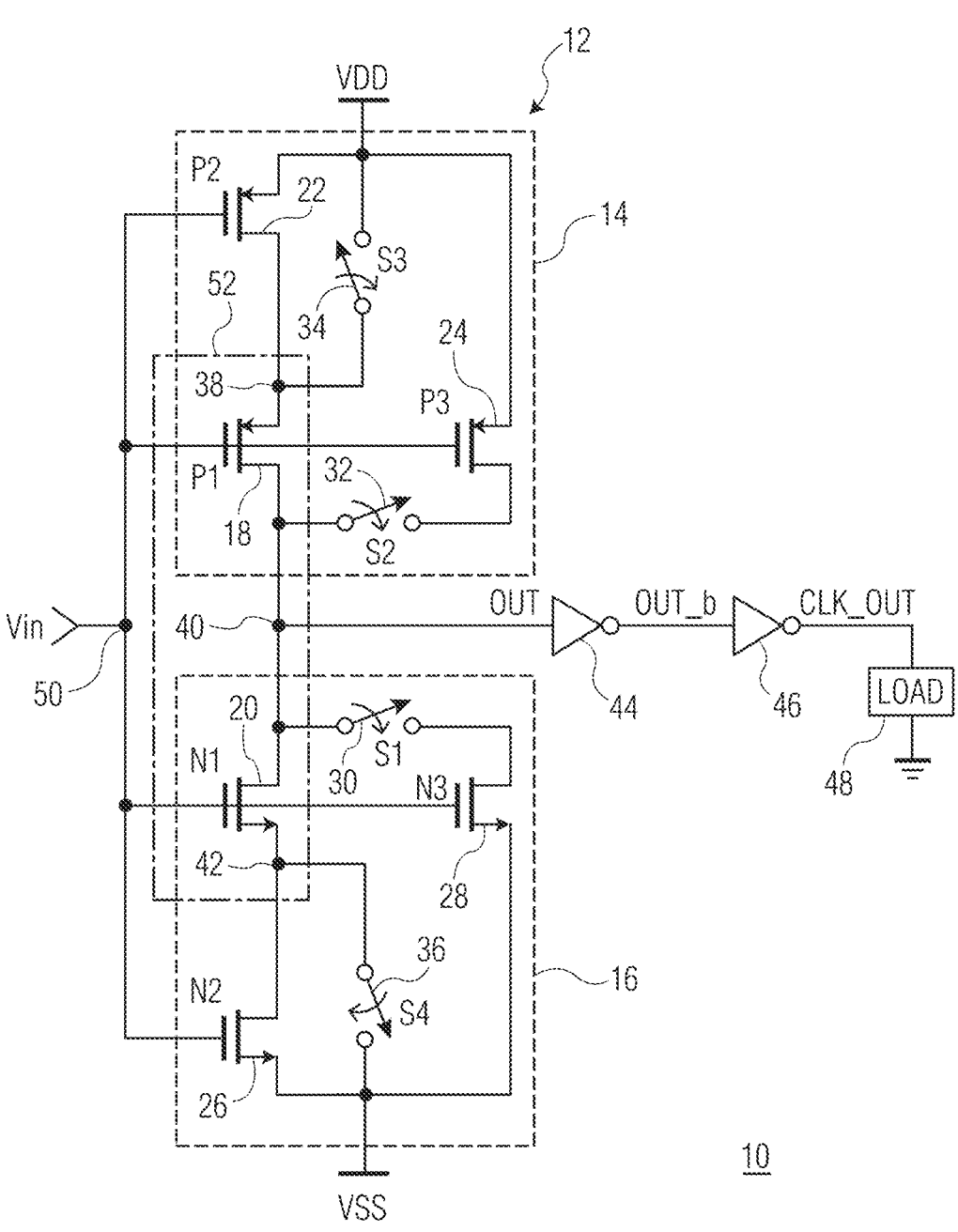
FIG. 1 illustrates, in partial block diagram and partial schematic form, a clock buffer circuit in accordance with one embodiment of the present invention.

FIG. 1 illustrates, in partial block diagram and partial schematic form, a clock buffer circuit 10 including an inverter circuit 12 coupled in series with inverters 44 and 46, in accordance with one embodiment of the present invention. Inverter circuit 12 includes a main inverter stage 52 which receives an input voltage (Vin) and provides an output voltage, OUT, which is the inverse of Vin. The input voltage may be provided from a clock source such as a crystal oscillator, which periodically oscillates between a low voltage (e.g. ground or 0V) and a high voltage (e.g. VDD). Inverter 44 is coupled to the output of inverter circuit 12 to receive OUT, and provides OUT_b, which is the inverse of OUT. Inverter 46 is coupled to the output of inverter 44 to receive OUT_b, and provides an output clock, CLK_OUT, which is the inverse of OUT_b, to a load 48. Note that the transition time of an output of inverter circuit 12, inverter 44, or inverter 46 refers to how long it takes the output to transition from the high to low voltage (or low to high voltage) in response to a transition at the input node.

Inverter circuit 12 includes p-channel metal-oxide semiconductor (PMOS) transistors P1 18, P2 22, and P3 24, n-channel metal-oxide semiconductor (NMOS) transistors N1 20, N2 26 and N3 28, and switches S1 30, S2 32, S3 34, and S4 36. As used herein, each of PMOS transistors 18, 22, and 24 may simply be referred to as P1, P2, and P3, respectively, each of NMOS transistors 20, 26, and 28 may simply be referred to as N1, N2, and N3, and each of switches 30, 32, 34, and 36 may simply be referred to as S1, S2, S3, and S4, respectively. P1 and N1 together form main inverter stage 52 of inverter circuit 12, in which control electrodes of P1 and N1 are coupled to an input node 50 coupled to receive Vin and first current electrodes of P1 and N1 are coupled to an output node 40 coupled to provide OUT. Input node 50 and output node 40 also correspond to the input and output, respectively, of inverter circuit 12. Note that P1, P2, and P3 form a pull-up network of inverter circuit 12, while N1, N2, and N3 form a pull-down network of inverter 12.

A second current electrode of P1 is coupled to a first current electrode of P2 at a circuit node 38, and a second current electrode of P2 is coupled to a first voltage supply terminal configured to receive a first supply voltage, e.g., VDD. A second current electrode of N1 is coupled to a first current electrode of N2 at a circuit node 42, and a second current electrode of N2 is coupled to a second voltage supply terminal configured to receive a second supply voltage, e.g., VSS (in which VSS may correspond to ground or 0V). The first supply voltage is greater than the second supply voltage. Note that in the descriptions herein, for simplicity, the first and second voltage supply terminals may simply be referred to as VDD and VSS. Control electrodes of P2 and N2 are also coupled to input node 50. First signal terminals of S2 and S1 are coupled to output node 40. A first current electrode of P3 is coupled to a second signal terminal of S2, a second current electrode of P3 is coupled to VDD, and a control electrode of P3 is also coupled to input node 50. A first current electrode of N3 is coupled to a second signal terminal of S1, a second current electrode of N3 is coupled to VSS, and a control electrode of N3 is also coupled to input node 50. A first signal terminal of S3 is coupled to node 38, a second signal terminal of S3 is coupled to VDD, a first signal terminal of S4 is coupled to node 42, and a second signal terminal of S4 is coupled to VSS.

Each of the switches of inverter circuit 12 (e.g. S1-S4) includes a first and second signal terminal controlled by a corresponding control signal. When the corresponding control signal has a first logic value, the switch is ON (i.e. closed) such that the first and second signal terminals are shorted together to transmit a current between the first and second signal terminals. When the corresponding control signal has a second logic value (opposite the first logic value), the switch is OFF (i.e. open) such that the first and second signals are not connected with each other, and a current is not transmitted between the first and second signal terminals. In the illustrated embodiment, each of S1-S4 receives one or more corresponding control signals (e.g. feedback signals) generated based on OUT_b or CLK_OUT. In one embodiment, each switch can be implemented as a transmission gate having two signal terminals, a control input and an inverse control input, as known in the art. For example, the transmission gate may include an NMOS transistor in parallel with a PMOS transistor, such that the transmission gate is ON (closed) when the control input (at the gate of the NMOS transistor) receives a logic level one (and the inverse control input, at the gate of the PMOS transistor, a logic level zero), and OFF (open) when the control input receives a logic level zero (and the inverse control input receives a logic level one). In this case, each control input and inverse control input of the switches can receive OUT_b or CLK_OUT. For example, the control inputs of S1 and S4 may be coupled to receive OUT_b while the inverse control inputs are coupled to receive CLK_OUT, and the control inputs of S2 and S3 may be coupled to receive CLK_OUT while the inverse control inputs are coupled to receive OUT_b. S1 and S2 are complementary switches in that they are controlled by complementary signals such that when one of the switches is closed, the other is open, and vice versa. S3 and S4 are also complementary switches.

In operation, the connection of the PMOS transistors in pull-up network 14 is controlled by S2 and S3 based on the output state, and the connection of the NMOS transistors in pull-down network 16 is controlled by S1 and S4 based on the output state. PMOS transistors in the pull-up network and NMOS transistors in the pull-down network are alternately coupled in series and parallel such that, at any particular instance, either PMOS transistors in the pull-up network are coupled in series while NMOS transistors in the pull-down network are coupled in parallel or PMOS transistors in the pull-up network are coupled in parallel while NMOS transistor in the pull-down network are coupled in series. When an additional transistor is coupled in series with either P1 or N1, the resistance of the pull-up or pull-down path, respectively, is increased, and when an additional transistor is coupled in parallel with either P1 or N1, the resistance is respectively decreased.

In a typical inverter, which includes a PMOS coupled in series with an NMOS (e.g. similar to P1 and N1 of the main inverter stage), while the input is transitioning between states, there is a time when both the PMOS and NMOS are both on and conducting current. This current corresponds to a short circuit current from supply to ground which occurs during the transition stage. It is desirable to reduce this short circuit current so as to reduce power consumption. Therefore, in the illustrated embodiment, through the addition of P2 and P3 to the pull-up network and N2 and N3 to the pull-down network and alternately coupling PMOS and NMOS transistors in series and parallel to control resistance of the pull-up and pull-down paths, the short circuit current may be reduced as compared to a typical inverter. Also, while resistance is increased (e.g. maximized) in the short circuit path (between VDD to ground) to reduce power consumption, the resistance of the logic path (from VDD to output node 40 in the charging phase and from output node 40 to ground in the discharging phase) is reduced (e.g. minimized) to reduce transition time.

Figure 2:
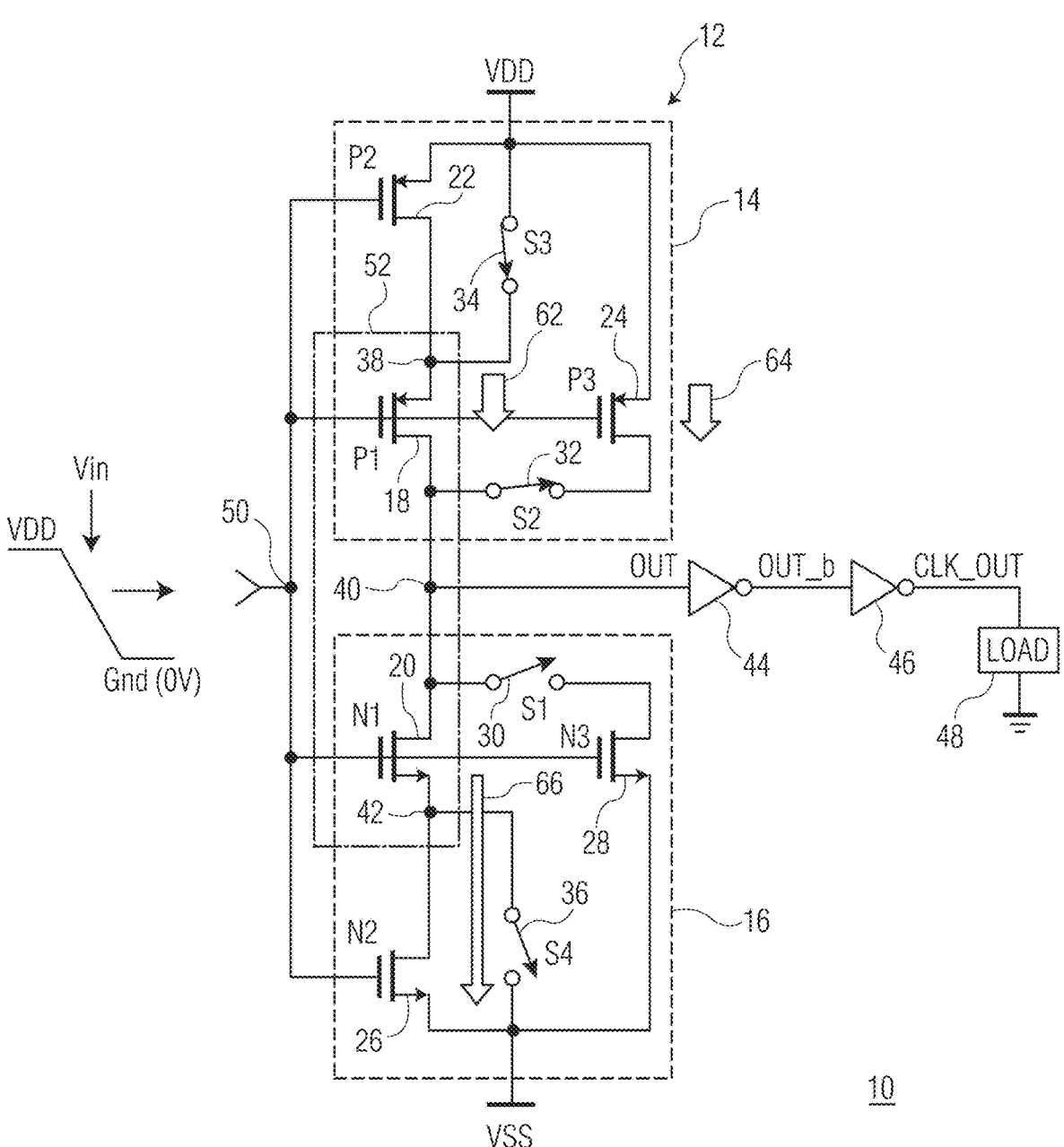
FIG. 2 illustrates, in partial block diagram and partial schematic form, the clock buffer circuit of FIG. 1 configured for a first transition, in accordance with one embodiment of the present invention.

FIG. 2 illustrates a first configuration of inverter circuit 12 in which a falling transition of Vin from high to low (e.g. VDD to VSS (0V)) is occurring. During this falling transition, switches S2 and S3 are closed while S1 and S4 are open. With S2 and S3 closed, P1 and P3 are connected in parallel with each other (while P2 is shorted out between node 38 and VDD by S3), resulting in reduced resistance. With S1 and S4 open, N1 and N2 are connected in series with each other (while N3 is removed from the pull-down circuit by S1), resulting in increased resistance. With the transition of Vin from VDD to VSS, output node 40 (OUT) is charged from VSS to VDD via the pull-up path between VDD and node 40 (illustrated by arrows 62 and 64 indicating the charging current). Therefore, this may be referred to as the charging phase of output node 40. With P1 and P3 in parallel during the charging phase, the rise transition time for OUT is reduced, due to the reduced resistance and thus increased pull-up strength of the pull-up path. Also, with N1 and N2 in series, the short circuit path between VDD and VSS during the transition experiences a higher resistance thus reducing the short circuit current (illustrated by a thinner arrow 66 identifying a reduced current through the pull-down circuit as compared to arrows 62 and 64 through the pull-up circuit).

Figure 3:
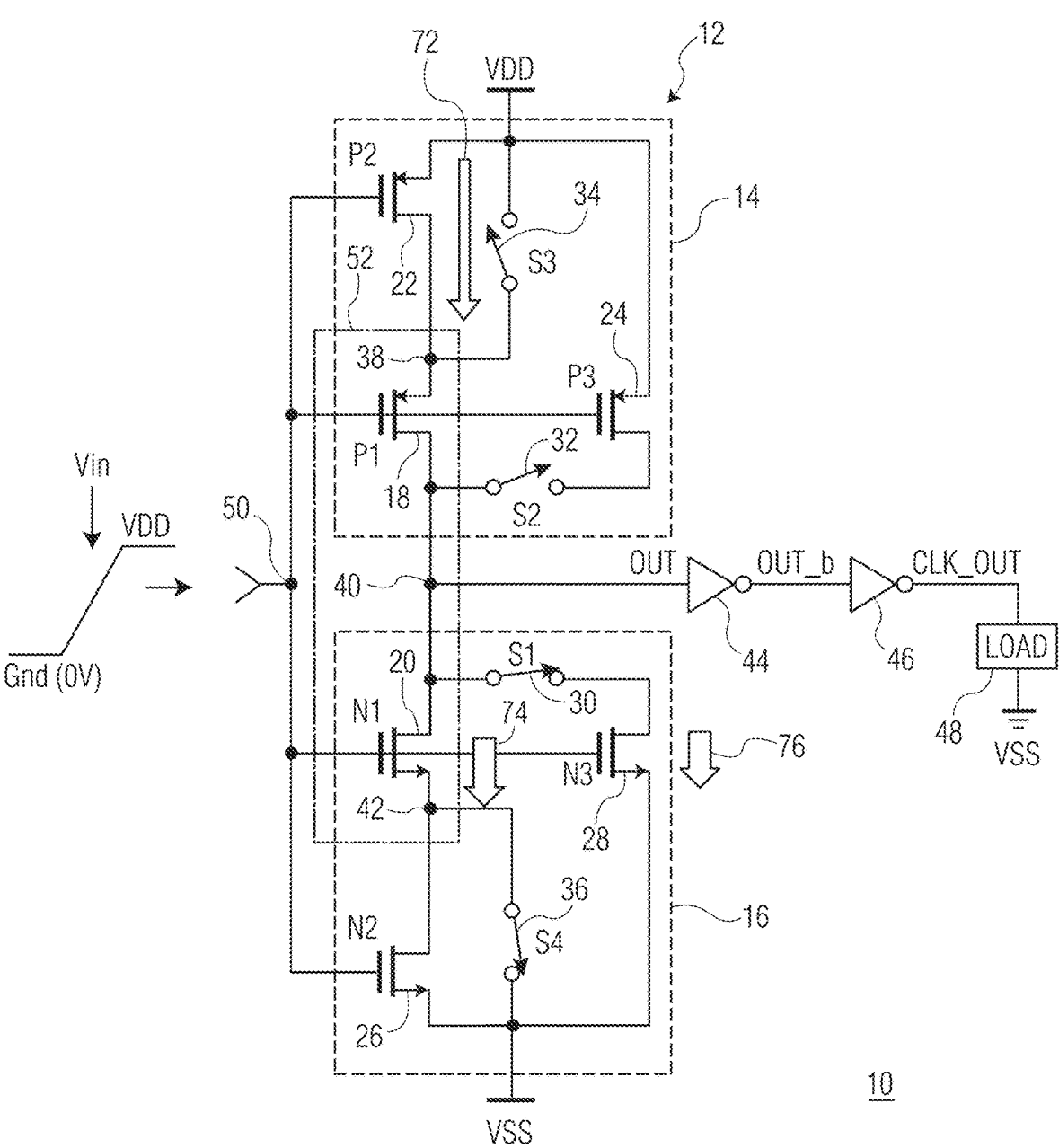
FIG. 3 illustrates, in partial block diagram and partial schematic form, the clock buffer circuit of FIG. 1 configured for a second transition, in accordance with one embodiment of the present invention.

FIG. 3 illustrates a second configuration of inverter circuit 12 in which a rising transition of Vin from low to high (e.g. VSS (0V) to VDD) is occurring. During this rising transition, switches S1 and S4 are closed while S2 and S3 are open. With S1 and S4 closed, N1 and N3 are connected in parallel with each other (while N2 is shorted out between node 42 and VSS by S4), resulting in reduced resistance. With S2 and S3 open, P1 and P2 are connected in series with each other (while P3 is removed from the pull-up circuit by S2), resulting in increased resistance. With the transition of Vin from VSS to VDD, output node 40 (OUT) is discharged from VDD to VSS via the pull-down path between node 40 and VSS (illustrated by arrows 74 and 76 indicating the discharge current). Therefore, this may be referred to as the discharging phase of output node 40. With N1 and N3 in parallel during the discharging phase, the fall transition time for OUT is reduced, due to the reduced resistance and thus increased pull-down strength of the pull-down path. Also, with P1 and P2 in series, the short circuit path between VDD and VSS during the transition experiences a higher resistance thus reducing the short circuit current (illustrated by a thinner arrow 72 identifying a reduced current through the pull-up circuit as compared to arrows 74 and 76 through the pull-down circuit).

Note that switches S1-S4 can be implemented using different logic configurations in place of or in additional to transmission gates. Also, to achieve the configurations of FIGS. 2 and 3 corresponding to the charging and discharging phases, respectively, the control signals of S1-S4 can be based on OUT_b or CLK_OUT, or a combination of these outputs. For example, referring first to FIG. 2, when Vin transitions from VDD to VSS, OUT begins at VSS and OUT_b at VDD and transitions to VDD and VSS, respectively, and the opposite occurs when Vin transitions from VSS to VDD. Therefore, S1-S4 can be controlled by OUT_b and CLK_OUT such that when OUT_b is asserted to a logic level one, S1 and S4 are closed, and when CLK_OUT is asserted to a logic level one, S2 and S3 are closed. Alternatively, other logic combinations of the outputs within clock buffer circuit 10, such as other combinations of feedback signals, can be used to control each switch of S1-S4.

Since the added transistors of P2, P3, N2, and N3 to main inverter stage 52 reduce each of the rising transition time and falling transition time, transitions of inverter circuit 12 are improved (i.e. reduced in time). Since the transitions at output node 40 of inverter circuit 12 are faster, the transitions at the input and output of inverter 44 as well as the transitions at the input and output of inverter 46 are also faster as compared to a clock buffer without inverter circuit 12. Therefore, clock buffer circuit 10 can include any number of inverters or buffers to generate CLK_OUT, in which all inverters or buffers which follow inverter circuit 12 may experience improved transition times. With the improved transition times, load 48 can be properly driven and the short circuit current in inverter circuit 12 and any of the subsequent inverters can be reduced or limited.

Therefore, by now it can be appreciated how additional transistors and switches within an inverter circuit of a clock buffer circuit can be used to improve transition times while reducing power consumption. For example, the switches can be used to place the inverter circuit into a first configuration for a charging phase which allows for a faster rising transition time and into a second configuration for a discharging phase which allows for a faster falling transition time. In this example, the first configuration places transistors in the pull-up network of the inverter circuit in parallel while placing transistors in the pull-down network in series, and the second configuration places transistors in the pull-down network in parallel while placing transistors in the pull-up network in series. The reduced transition times may therefore allow for reduced short circuit currents, resulting in reduced power consumption by the clock buffer circuit.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In one embodiment, the illustrated elements of clock buffer circuit 10 are circuitry located on a single integrated circuit or within a same device, while a clock source for Vin may be located either on the single integrated circuit or external to the single integrated circuit.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, clock buffer circuit 10 may include buffers in addition to or in place of inverters 44 and 46 following inverter circuit 12. Also, the functionality of switches S1-S4 and the layout of additional transistors such as P2, P3, N2, and N3 may be implemented differently and may use a different number of switches or additional transistors (or both) to achieve asymmetrical strengths of the pull-up and pull-down network during the charging phage vs the discharging phase. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In an embodiment, an integrated circuit includes an inverter circuit having an input node coupled to receive an input signal and an output node configured to provide an output signal corresponding to the inverse of the input signal. The inverter circuit includes a main inverter stage having a first transistor of a first conductivity type coupled in series with a second transistor of a second conductivity type, wherein control electrodes of the first and second transistors are coupled to the input node and first current electrodes of the first and second transistors are coupled at the output node; a first set of additional transistors of the first conductivity type; a second set of additional transistors of the second conductivity type; and a set of switches configured to connect a first transistor of the first set of additional transistors in series with the first transistor for a first time period while connecting a first transistor of the second set of additional transistors in parallel with the second transistor during the first time period. In one aspect, the set of switches is further configured to connect a second transistor of the first set of additional transistors in parallel with the first transistor for a second time period while connecting a second transistor of the second set of additional transistors in series with the second transistor during the second time period, the first and second time periods being mutually exclusive. In a further aspect, the first time period is characterized as one of a charging phase or discharging phase of the output node, and the second time period is characterized as another one of the charging phase or discharging phase of the output node. In another aspect of the embodiment, the integrated circuit further includes a clock buffer circuit which includes the inverter circuit, and further includes a set of inverters having an input coupled to the output node of the inverter circuit, and having an output coupled to provide a clock output corresponding to the input signal. In a further aspect, the input signal is generated based on a crystal oscillator. In another further aspect, the sets of switches is controlled by one or more output signals generated by the set of inverters. In another aspect, the first conductivity type corresponds to p-channel transistors and the second conductivity type corresponds to n-channel transistors. In a further aspect, the first transistor and the first set of additional transistors form a pull-up network of the inverter circuit, and the second transistor and the second set of additional transistors form a pull-down network of the inverter circuit.

In another embodiment, an integrated circuit includes an inverter circuit having an input node coupled to receive an input signal and an output node configured to provide an output signal. The inverter circuit includes a first transistor having a first current electrode coupled to a first voltage supply terminal, a control electrode coupled to the input node, and a second current electrode; a second transistor having a first current electrode coupled to the second current electrode of the first transistor at a first circuit node, a control electrode coupled to the input node, and a second current electrode coupled to the output node; a third transistor having a first current electrode coupled to the first voltage supply terminal, a control electrode coupled to the input node, and a second current electrode; a first switch coupled between the first circuit node and the first voltage supply terminal; and a second switch coupled between the output node and the second current electrode of the third transistor, wherein each of the first and second switches is controlled based on the output signal, and each of the first, second, and third transistors are of a first conductivity type. In one aspect, the integrated circuit includes a clock buffer circuit configured to provide an output clock in which the clock buffer circuit includes the inverter circuit and further includes a set of inverters including a first inverter having an input coupled to the output node of the inverter circuit and an output configured to provide a second output signal, wherein the output clock is generated from the second output signal, and wherein each of the first and second switches is controlled based at least on the second output signal. In another aspect, when the first and second switches are closed, the second and third transistors are connected in parallel to form one of a charging path or discharging path between the first voltage supply terminal and the output node. In a further aspect, when the first and second switches are open, the first and second transistors are connected in series between the first voltage supply terminal and the output node. In another aspect, the first conductivity type corresponds to p-channel transistors, and the inverter circuit further includes a fourth transistor having a first current electrode coupled to a second voltage supply terminal, a control electrode coupled to the input node, and a second current electrode; a fifth transistor having a first current electrode coupled to the second current electrode of the fourth transistor at a second circuit node, a control electrode coupled to the input node, and a second current electrode coupled to the output node; a sixth transistor having a first current electrode coupled to the second voltage supply terminal, a control electrode coupled to the input node, and a second current electrode; a third switch coupled between the second circuit node and second first voltage supply terminal; and a fourth switch coupled between the output node and the second current electrode of the sixth transistor, wherein each of the third and fourth switches is controlled based on the output signal, and each of the fourth, fifth, and sixth transistors correspond to n-channel transistors. In a further aspect, the first, second, third, and fourth switches are configured to, during falling transitions of the input signal, connect the second and third transistors in parallel with each other between the first voltage supply terminal and the output node to form a charging path to charge the output node. In yet a further aspect, the first, second, third, and fourth switches are further configured to, during the falling transitions, connect the fourth and fifth transistors in series between the output node and the second voltage supply terminal. In another yet further aspect, the first, second, third, and fourth switches are further configured to, during rising transitions of the input signal, connect the fifth and sixth transistors in parallel with each other between the output node and the second voltage supply terminal to form a discharge path to discharge the output node. In yet a further aspect, the first, second, third, and fourth switches are further configured to, during the rising transitions, connect the first and second transistors in series between the first voltage supply terminal and the output node.

In yet another embodiment, an integrated circuit includes a clock buffer circuit in which the clock buffer circuit includes an inverter circuit having an input node coupled to receive an input signal and an output node configured to provide an output signal. The inverter circuit includes a first PMOS transistor having a first current electrode coupled to a first voltage supply terminal, a control electrode coupled to the input node, and a second current electrode; a second PMOS transistor having a first current electrode coupled to the second current electrode of the first transistor at a first circuit node, a control electrode coupled to the input node, and a second current electrode coupled to the output node; a third PMOS transistor having a first current electrode coupled to the first voltage supply terminal, a control electrode coupled to the input node, and a second current electrode; a first switch coupled between the first circuit node and the first voltage supply terminal; a second switch coupled between the output node and the second current electrode of the third transistor; a fourth NMOS transistor having a first current electrode coupled to a second voltage supply terminal, a control electrode coupled to the input node, and a second current electrode; a fifth NMOS transistor having a first current electrode coupled to the second current electrode of the fourth transistor at a second circuit node, a control electrode coupled to the input node, and a second current electrode coupled to the output node; a sixth NMOS transistor having a first current electrode coupled to the second voltage supply terminal, a control electrode coupled to the input node, and a second current electrode; a third switch coupled between the second circuit node and second first voltage supply terminal; and a fourth switch coupled between the output node and the second current electrode of the sixth transistor; and a set of inverters having an input coupled to receive the output signal and an output coupled to provide an output clock. In one aspect, of the yet another embodiment, the first, second, third, and fourth switches are configured such that they alternately connect the second and third PMOS transistors in parallel while connecting the fourth and fifth NMOS transistors in series and connect the fifth and sixth NMOS transistors in parallel while connecting the first and second PMOS transistors in series. In a further aspect, the first, second, third, and fourth switches are configured to connect the second and third PMOS transistors in parallel during charging phases of the output node occurring in response to falling transitions of the input signal and to connect the fifth and sixth NMOS transistors in parallel during discharging phases of the output node occurring in response to rising transitions of the input signal.

We claim:

1. An integrated circuit comprising:
an inverter circuit having an input node coupled to receive an input signal and an output node configured to provide an output signal corresponding to the inverse of the input signal, wherein the inverter circuit comprises:
a main inverter stage having a first transistor of a first conductivity type coupled in series with a second transistor of a second conductivity type, wherein control electrodes of the first and second transistors are coupled to the input node and first current electrodes of the first and second transistors are coupled at the output node;
a first set of additional transistors of the first conductivity type;
a second set of additional transistors of the second conductivity type; and
a set of switches configured to connect a first transistor of the first set of additional transistors in series with the first transistor for a first time period while connecting a first transistor of the second set of additional transistors in parallel with the second transistor during the first time period, wherein:
the set of switches is further configured to connect a second transistor of the first set of additional transistors in parallel with the first transistor for a second time period while connecting a second transistor of the second set of additional transistors in series with the second transistor during the second time period, the first and second time periods being mutually exclusive, and
the first time period is characterized as one of a charging phase or discharging phase of the output node, and the second time period is characterized as another one of the charging phase or discharging phase of the output node.

2. The integrated circuit of claim 1, wherein the first conductivity type corresponds to p-channel transistors and the second conductivity type corresponds to n-channel transistors.

3. The integrated circuit of claim 2, wherein the first transistor and the first set of additional transistors form a pull-up network of the inverter circuit, and the second transistor and the second set of additional transistors form a pull-down network of the inverter circuit.

4. An integrated circuit, comprising:
an inverter circuit having an input node coupled to receive an input signal and an output node configured to provide an output signal corresponding to the inverse of the input signal, wherein the inverter circuit comprises:
a main inverter stage having a first transistor of a first conductivity type coupled in series with a second transistor of a second conductivity type, wherein control electrodes of the first and second transistors are coupled to the input node and first current electrodes of the first and second transistors are coupled at the output node;
a first set of additional transistors of the first conductivity type;
a second set of additional transistors of the second conductivity type;
a set of switches configured to connect a first transistor of the first set of additional transistors in series with the first transistor for a first time period while connecting a first transistor of the second set of additional transistors in parallel with the second transistor during the first time period; and
a clock buffer circuit, the clock buffer circuit comprising the inverter circuit, and further comprising:
a set of inverters having an input coupled to the output node of the inverter circuit, and having an output coupled to provide a clock output corresponding to the input signal.

5. The integrated circuit of claim 4, wherein the input signal is generated based on a crystal oscillator.

6. The integrated circuit of claim 4, wherein the sets of switches is controlled by one or more output signals generated by the set of inverters.

7. The integrated circuit of claim 4, wherein the first conductivity type corresponds to p-channel transistors and the second conductivity type corresponds to n-channel transistors.

8. The integrated circuit of claim 7, wherein the first transistor and the first set of additional transistors form a pull-up network of the inverter circuit, and the second transistor and the second set of additional transistors form a pull-down network of the inverter circuit.

9. An integrated circuit comprising:
an inverter circuit having an input node coupled to receive an input signal and an output node configured to provide an output signal, wherein the inverter circuit comprises:
a first transistor having a first current electrode coupled to a first voltage supply terminal, a control electrode coupled to the input node, and a second current electrode;
a second transistor having a first current electrode coupled to the second current electrode of the first transistor at a first circuit node, a control electrode coupled to the input node, and a second current electrode coupled to the output node;
a third transistor having a first current electrode coupled to the first voltage supply terminal, a control electrode coupled to the input node, and a second current electrode;
a first switch coupled between the first circuit node and the first voltage supply terminal; and
a second switch coupled between the output node and the second current electrode of the third transistor, wherein each of the first and second switches is controlled based on the output signal, and each of the first, second, and third transistors are of a first conductivity type.

10. The integrated circuit of claim 9, wherein the integrated circuit comprises a clock buffer circuit configured to provide an output clock, the clock buffer circuit comprising the inverter circuit and further comprising:
a set of inverters including a first inverter having an input coupled to the output node of the inverter circuit and an output configured to provide a second output signal, wherein the output clock is generated from the second output signal, and wherein each of the first and second switches is controlled based at least on the second output signal.

11. The integrated circuit of claim 9, wherein when the first and second switches are closed, the second and third transistors are connected in parallel to form one of a charging path or discharging path between the first voltage supply terminal and the output node.

12. The integrated circuit of claim 11, wherein when the first and second switches are open, the first and second transistors are connected in series between the first voltage supply terminal and the output node.

13. The integrated circuit of claim 9, wherein the first conductivity type corresponds to p-channel transistors, and the inverter circuit further comprises:

a fourth transistor having a first current electrode coupled to a second voltage supply terminal, a control electrode coupled to the input node, and a second current electrode;

a fifth transistor having a first current electrode coupled to the second current electrode of the fourth transistor at a second circuit node, a control electrode coupled to the input node, and a second current electrode coupled to the output node;

a sixth transistor having a first current electrode coupled to the second voltage supply terminal, a control electrode coupled to the input node, and a second current electrode;

a third switch coupled between the second circuit node and second first voltage supply terminal; and a fourth switch coupled between the output node and the second current electrode of the sixth transistor, wherein each of the third and fourth switches is controlled based on the output signal, and each of the fourth, fifth, and sixth transistors correspond to n-channel transistors.

14. The integrated circuit of claim 13, wherein the first, second, third, and fourth switches are configured to, during falling transitions of the input signal, connect the second and third transistors in parallel with each other between the first voltage supply terminal and the output node to form a charging path to charge the output node.

15. The integrated circuit of claim 14, wherein the first, second, third, and fourth switches are further configured to, during the falling transitions, connect the fourth and fifth transistors in series between the output node and the second voltage supply terminal.

16. The integrated circuit of claim 14, wherein the first, second, third, and fourth switches are further configured to, during rising transitions of the input signal, connect the fifth and sixth transistors in parallel with each other between the output node and the second voltage supply terminal to form a discharge path to discharge the output node.

17. The integrated circuit of claim 16, wherein the first, second, third, and fourth switches are further configured to, during the rising transitions, connect the first and second transistors in series between the first voltage supply terminal and the output node.

18. An integrated circuit having a clock buffer circuit, the clock buffer circuit comprising:

an inverter circuit having an input node coupled to receive an input signal and an output node configured to provide an output signal, wherein the inverter circuit comprises:

a first PMOS transistor having a first current electrode coupled to a first voltage supply terminal, a control electrode coupled to the input node, and a second current electrode;

a second PMOS transistor having a first current electrode coupled to the second current electrode of the first transistor at a first circuit node, a control electrode coupled to the input node, and a second current electrode coupled to the output node;

a third PMOS transistor having a first current electrode coupled to the first voltage supply terminal, a control electrode coupled to the input node, and a second current electrode;

a first switch coupled between the first circuit node and the first voltage supply terminal;

a second switch coupled between the output node and the second current electrode of the third transistor;

a fourth NMOS transistor having a first current electrode coupled to a second voltage supply terminal, a control electrode coupled to the input node, and a second current electrode;

a fifth NMOS transistor having a first current electrode coupled to the second current electrode of the fourth transistor at a second circuit node, a control electrode coupled to the input node, and a second current electrode coupled to the output node;

a sixth NMOS transistor having a first current electrode coupled to the second voltage supply terminal, a control electrode coupled to the input node, and a second current electrode;

a third switch coupled between the second circuit node and second first voltage supply terminal; and a fourth switch coupled between the output node and the second current electrode of the sixth transistor; and a set of inverters having an input coupled to receive the output signal and an output coupled to provide an output clock.

19. The integrated circuit of claim 18, wherein the first, second, third, and fourth switches are configured such that they alternately connect the second and third PMOS transistors in parallel while connecting the fourth and fifth NMOS transistors in series and connect the fifth and sixth NMOS transistors in parallel while connecting the first and second PMOS transistors in series.

20. The integrated circuit off claim 19, wherein the first, second, third, and fourth switches are configured to connect the second and third PMOS transistors in parallel during charging phases of the output node occurring in response to falling transitions of the input signal and to connect the fifth and sixth NMOS transistors in parallel during discharging phases of the output node occurring in response to rising transitions of the input signal.

* * * * *